United States Patent
Kim

(10) Patent No.: US 7,420,407 B2
(45) Date of Patent: Sep. 2, 2008

(54) DEVICE FOR CONTROLLING INTERNAL VOLTAGE

(75) Inventor: Dong-Kyun Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 86 days.

(21) Appl. No.: 11/520,560

(22) Filed: Sep. 14, 2006

(65) Prior Publication Data

US 2007/0070721 A1    Mar. 29, 2007

(30) Foreign Application Priority Data

Sep. 14, 2005    (KR) .................. 10-2005-0085691

(51) Int. Cl.
*H01H 37/76* (2006.01)
(52) U.S. Cl. ................................................ 327/525
(58) Field of Classification Search ............ 327/308, 327/525
See application file for complete search history.

(56) References Cited

U.S. PATENT DOCUMENTS

| 5,450,030 | A | * | 9/1995 | Shin et al. ............ 327/525 |
| 5,767,732 | A | * | 6/1998 | Lee et al. ............ 327/525 |
| 6,690,525 | B2 | | 2/2004 | Ruegg et al. |
| 2004/0013026 | A1 | | 1/2004 | Ryoo |

FOREIGN PATENT DOCUMENTS

| JP | 2004-055107 | 2/2004 |
| KR | 1998-079496 | 11/1998 |
| KR | 10-2004-0038787 | 5/2004 |

* cited by examiner

*Primary Examiner*—Jeffrey S Zweizig
(74) *Attorney, Agent, or Firm*—McDermott Will & Emery LLP

(57) ABSTRACT

A device controls internal voltage. Increased reliability of a semiconductor memory device is obtained by increasing or decreasing a level of internal reference voltage according to change of the device. Fuse ROMs generate fuse signals having different levels according to a cutting condition of each fuse. A bit counter performs up/down counting operation in response to a count control signal after setting the fuse signals to initial values in response to a set signal and generates counter output signals which are higher or lower than the initial values by a counting number. A decoder decodes the counter output signals and activates one of switching signals. A reference voltage selector provides a trimming level of internal reference voltage in response to the switching signals and generating reference voltage.

12 Claims, 4 Drawing Sheets

(REALTED ART)

US 7,420,407 B2

DEVICE FOR CONTROLLING INTERNAL VOLTAGE

FIELD OF THE INVENTION

The present invention relates to a device for controlling internal voltage; and, more particularly, to a scheme for increasing reliability of a semiconductor memory device by increasing or decreasing a level of internal reference voltage according to changes of the device.

BACKGROUND

Characteristics or performances of semiconductor memory devices are not equal to those of each other because conditions or circumstances for producing plural semiconductor memory devices in wafers, e.g., mass production, are not exactly and continuously kept. Particularly circumstance changes on fabrication process, i.e., PVT (Process, Voltage and Temperature), according to each memory chip are considered in order to revise the reference voltage VREF to target level.

FIG. 1 is a block diagram of a conventional internal voltage control device.

The conventional internal voltage control device includes a fuse ROM block 10, a decoder 20, an internal reference generator 30, a reference voltage selector 40 and a voltage comparator 50.

Each fuse ROM is provided with a fuse F, inverters IV1 to IV3 and a NMOS transistor N. The fuse F is connected between supply voltage and the NMOS transistor N. The NMOS transistor N connected between the fuse F and ground voltage receives a fuse enable signal FEN through a gate. The first and the second inverters IV1 and IV2 latch output of the fuse F. The third inverter IV3 inverting output of the latch outputs plural fuse signals FU<0> to FU<i−1>. Herein, i is a positive integer.

In addition, the decoder 20 decodes the plural fuse signals FU<0> to FU<i−1> and outputs plural switching signals SW<0> to SW<k−1>. Herein, k is positive integer. The internal reference generator 30 generates internal reference voltage PRE_VREF. The reference voltage selector 40 trims the internal reference voltage PRE_VREF according to the plural switching signals SW<0>-SW<k−1> and outputs reference voltage VREF.

The reference voltage selector 40 is provided with k number of NMOS transistors N0 to Nk−1, k+1 number of resisters R0 to Rk connected in series. The plural NMOS transistors N0 to Nk−1 respectively connected between the plural resisters R0 to Rk and an output stage of the reference voltage VREF receive corresponding switching signal through gates. Accordingly the plural NMOS transistors are switched selectively.

The voltage comparator 50 is provided with an amplifier 51 and first and second resisters Ra to Rb. The amplifier 51 compares the reference voltage VREF and output of the resisters Ra to Rb, generating internal voltage VINT. The resisters Ra to Rb divide the internal voltage VINT through resister-division and output divided internal voltage VINT to the amplifier 51.

The conventional operation process of the internal voltage control device of FIG. 1 is described below.

When the fuse enable signal FEN is activated, the fuse ROMs are initialized. The NMOS transistor N turns on and node AA maintains low level during high pulse period of the fuse enable signal FEN. When the fuse enable signal FEN has low value, the node AA has high value through the fuse F. If the fuse F is cut electrically or physically, the node AA is disconnected with the supply voltage and the node AA has low value. As a result, fuse signals FU are controlled. Each fuse signal, i.e., the output of fuse ROM, is output at a logic high state if the fuse F is cut. On the contrary, a fuse signal having a logic low state is output in case that the fuse F is not cut.

Thereafter, the decoder 20 decodes the plural fuse signals FU<0> to FU<i−1> and outputs the plural switching signals SW<0> to SW<k−1>. The decoder 20 activates a corresponding signal of the plural switching signal SW<0> to SW<k−1> according to the fuse signals output high.

The internal reference generator 30 outputs an internal reference voltage PRE_VREF having a stably settled level regardless of an external voltage level and a chip temperature. However, the internal reference generator 30 cannot adjust a level of the internal reference voltage PRE_VREF in response to process change in fabrication. Accordingly each reference voltage PRE_VREF generated in each memory chip has a different level.

In order to trim the internal reference voltage PRE_VREF, the reference voltage selector 40 turns on one of the plural NMOS transistors N0 to Nk−1 according to the plural switching signals SW<0> to SW<k−1>, outputting a reference voltage VREF. Thereafter, the voltage comparator 50 outputs the internal voltage VINT having a predetermined voltage level based on the reference voltage VREF.

The internal voltage VINT is defined as follows.

$$VINT=((Ra+Rb)/Rb)*VREF$$

The constant reference voltage VREF is required to output constant internal voltage VINT coping with process change. The reference voltage selector 40 switches the plural NMOS transistor N0 to Nk−1 selectively, generating constant level of reference voltage VREF.

In the event that level of the internal reference voltage PRE_VREF is high, a NMOS transistor Nk, herein k is a large number, turns on. In the event that level of the internal reference voltage PRE_VREF is low, a NMOS transistor Nk, herein k is a small number, turns on. Constant reference voltage VREF is output. For the above described operation, one of the k number switching signals SW<0> to SW<k−1> is activated by the operation of the fuse ROM block 10 and the decoder 20 after the reference voltage VREF or the internal voltage VINT is monitored in the manufactured chip.

The step for changing internal voltage through reliability or a worst condition test in a quality control process of conventional semiconductor memory chip is required. However, the level of the pre-programed internal voltage VINT is not changed in a conventional device controlling an internal voltage. Generating a stable internal voltage based on process changes in a semiconductor memory device is difficult.

SUMMARY OF THE INVENTION

It is, therefore, an object of the present invention to provide a voltage controller for increasing or decreasing a level of internal reference voltage, which is programmed as a predetermined level, by using a counter to cope with process changes of a semiconductor memory device and increasing a reliability of the semiconductor memory device.

In accordance with an aspect of the present invention, there is provided an internal voltage controller, including a fuse ROM block for generating plural fuse signals having different levels according to a cutting condition of each fuse, a bit counter for performing up/down counting operation in response to a count control signal after setting the plural fuse signals to initial values in response to a set signal and for generating plural counter output signals which are higher or lower than the initial values by counting number, a decoder for decoding the plural counter output signals and activating one of plural switching signals and a reference voltage selector for controlling level of internal reference voltage in response to the switching signals and generating reference voltage.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a semiconductor device in accordance with the present invention will be described in detail referring to the accompanying drawings.

Figure 1:
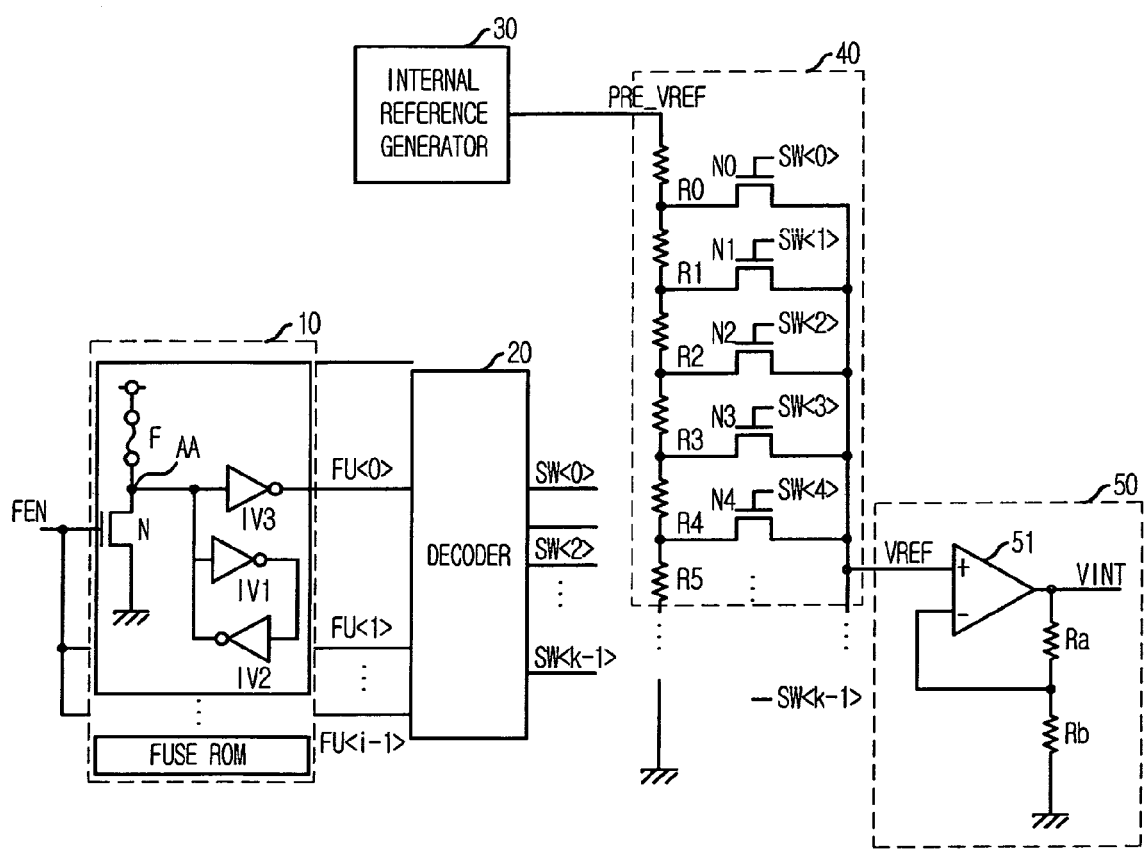
FIG. 1 is a block diagram of a conventional internal voltage control device.
Figure 2:
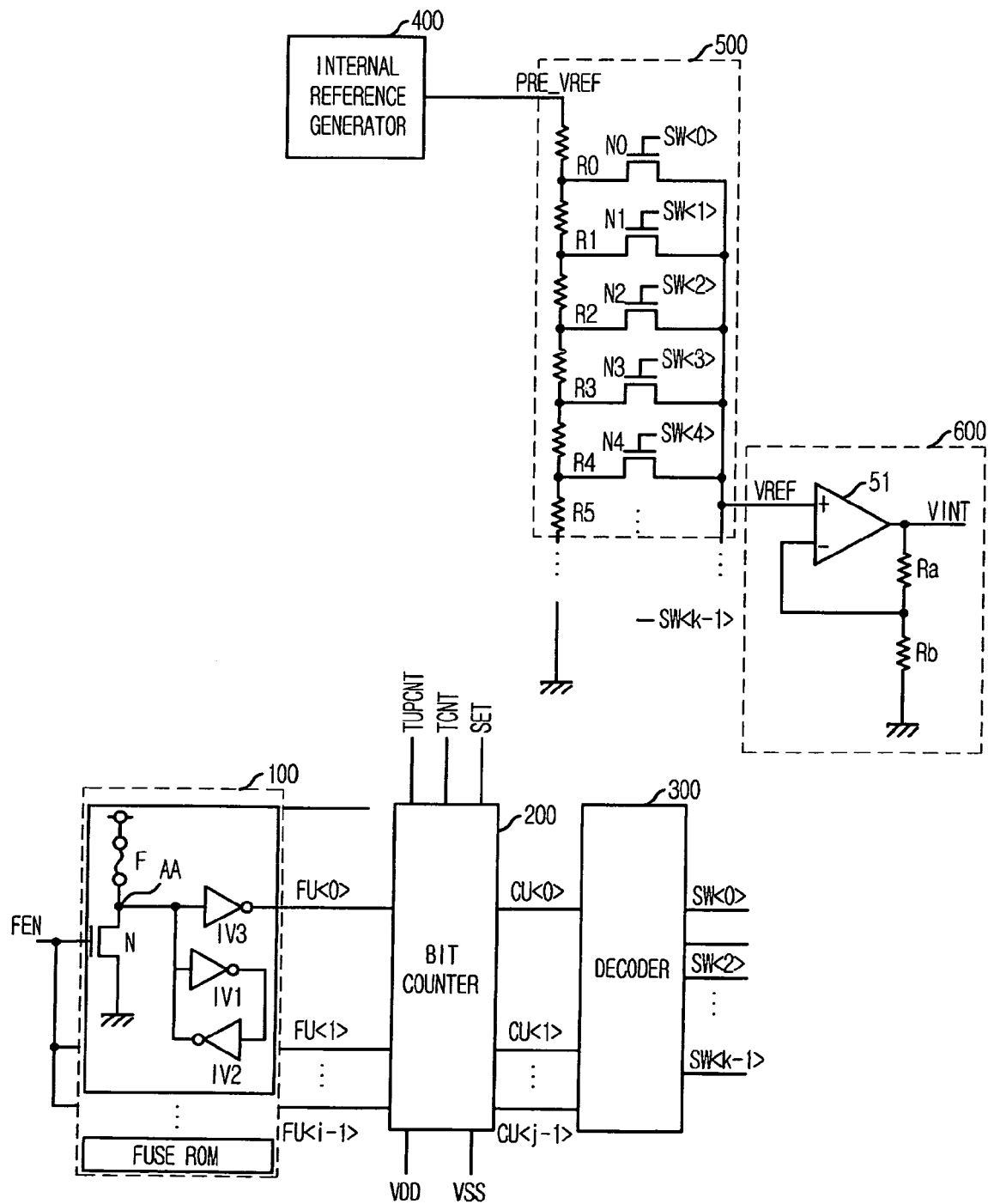
FIG. 2 is a block diagram of an internal voltage control device in accordance with the present invention.

FIG. 2 is a block diagram of an internal voltage control device in accordance with the present invention.

The internal voltage control device includes fuse ROM block 100, a bit counter 200 a decoder 300, a reference voltage selector 500 and a voltage comparator 600.

The fuse ROM block 100, the reference voltage selector 500 and the voltage comparator 600 have the same composition as the conventional device described above, and are described with the same characters used in the conventional device.

The each fuse ROM is provided with a fuse F, inverters IV1 to IV3 and a NMOS transistor N. The fuse F is connected between supply voltage and the NMOS transistor N. The NMOS transistor N connected between the fuse F and ground voltage receive a fuse enable signal FEN through a gate. The first and the second inverters IV1 and IV2 latch output of the fuse F. The third inverter IV3 inverting output of the latch outputs plural fuse signals FU<0> to FU<i−1>. Herein, i is a positive integer.

In addition, the bit counter 200 receives i number of fuse signals FU<0> to FU<i−1> from the fuse ROM block 100 and outputs j number of counter output signals CU<0> to CU<j−1> according to each count control signal TUPCNT, count signal TCNT and set signal SET. Herein, j is larger than i and i and j are natural numbers. The bit number of outputs from the bit counter 200 is larger than the bit number of inputs from the fuse ROM block 100. The embodiment of the present invention is explained wherein j which is larger than i by 2. The bit counter 200 initializes programmed values in the fuse ROM block 100 and performs a up/down counting operation.

Continuously, the decoder 300 decodes the j number of counter output signals CU<0> to CU<i+1> and outputs plural switching signals SW<0> to SW<k−1>. The internal reference generator 400 generates internal reference voltage PRE_VREF. The reference voltage selector 500 trims the internal reference voltage PRE_VREF according to the plural switching signals SW<0> to SW<k−1> and outputs reference voltage VREF.

The reference voltage selector 500 is provided with k number of NMOS transistors N0 to Nk−1, k+1 number of resisters R0 to Rk connected in series. The plural NMOS transistors N0 to Nk−1 respectively connected between the plural resisters R0 to Rk and an output stage of the reference voltage VREF receive corresponding switching signal through gates. Accordingly the plural NMOS transistors are switched selectively.

The voltage comparator 600 is provided with an amplifier 51 and first and second resisters Ra to Rb. The amplifier 51 compares the reference voltage VREF and output of the resisters Ra to Rb, generating internal voltage VINT. The resisters Ra to Rb divide the internal voltage VINT through resister-division and output divided internal voltage VINT to the amplifier 51.

Figure 3:
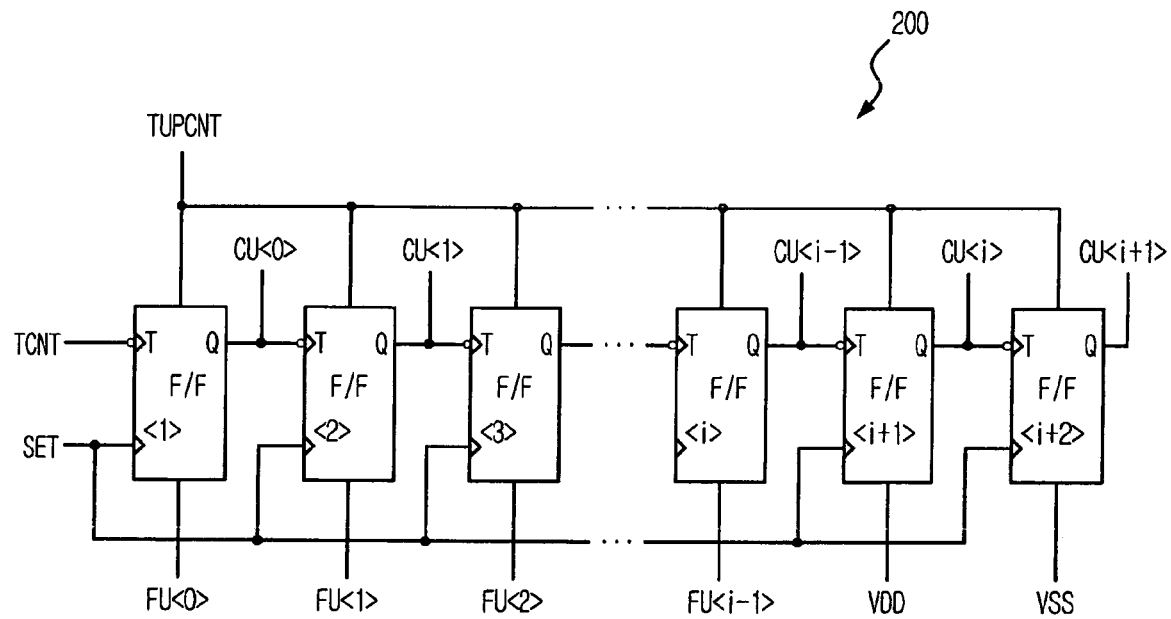
FIG. 3 is a schematic circuit diagram of a bit counter shown in FIG. 2.

FIG. 3 is a schematic circuit diagram of the bit counter 200 shown in FIG. 2.

The bit counter 200 is provided with plural flip-flops F/F<1> to F/F<i+2> connected in series. A first flip-flop F/F<1> receives a count signal TCNT. The plural flip-flops F/F<1> to F/F<i> receive the plural fuse signals FU<0> to FU<i−1> input from fuse ROM block 100.

The supply voltage VDD and the ground voltage VSS are set to initial value respectively in last two flip-flops F/F<i> and F/F<i+1>. Accordingly, the counter output signal CU<i> has one value and the counter output signal CU<i+1> has zero value in initial operation. When all initial values of the fuse signals are zero, $2^{i-1}$ number of down counting is performed. When all initial values of the fuse signals are one, $2^{i-1}$ number of up counting is performed.

Each flip-flop F/F<1> to F/F<i+2> receives high pulse in response to activation of the set signal SET. The plural fuse signals FU<0> to FU<i−1> input from fuse ROM block 100 are stored as an initial value of each counter in the activation period. From the initial value, the each flip-flops F/F<1> to F/F<i+2> perform up-counting or down-counting operation according to the count control signal TUPCNT and output the plural counter output signals CU<0> to CU<i+1>.

Through the plural counter output signals CU<0> to CU<i+1>, it is possible to generate reference voltage VREF which is higher or lower than a reference voltage programmed in fuse ROM block 100 by counting-number.

Figure 4:
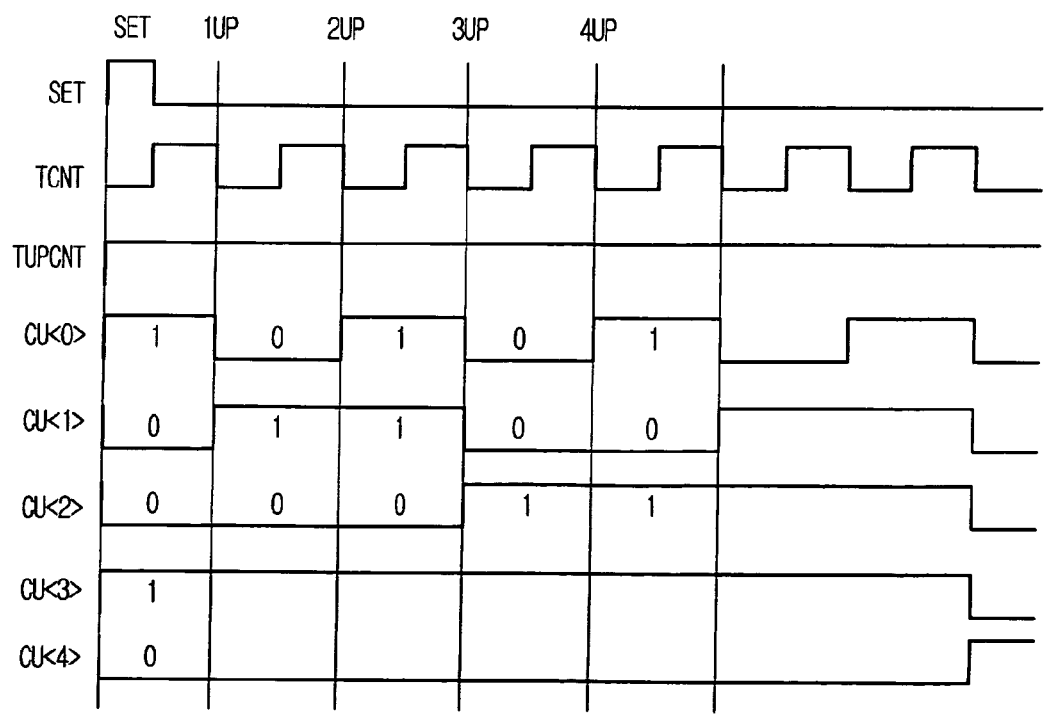
FIG. 4 is a timing diagram illustrating an up-counting operation of the internal voltage control device shown in FIG. 2.

FIG. 4 is a timing diagram illustrating the up-counting operation of the internal voltage control device shown in FIG. 2. As an example embodiment of the present invention, the case wherein i is 3 is explained.

When the count control signal TUPCNT becomes logic high level and the count signal TCNT is input, the bit counter 200 performs an up-counting operation from an initialized value. The plural flip-flops perform a counting operation in synchronization with a falling edge of the count signal TCNT. How many the count signal TCNT is toggled means the number of up-counting. A code which is higher than a programmed value in the fuse block by counting-number could be generated.

Figure 5:
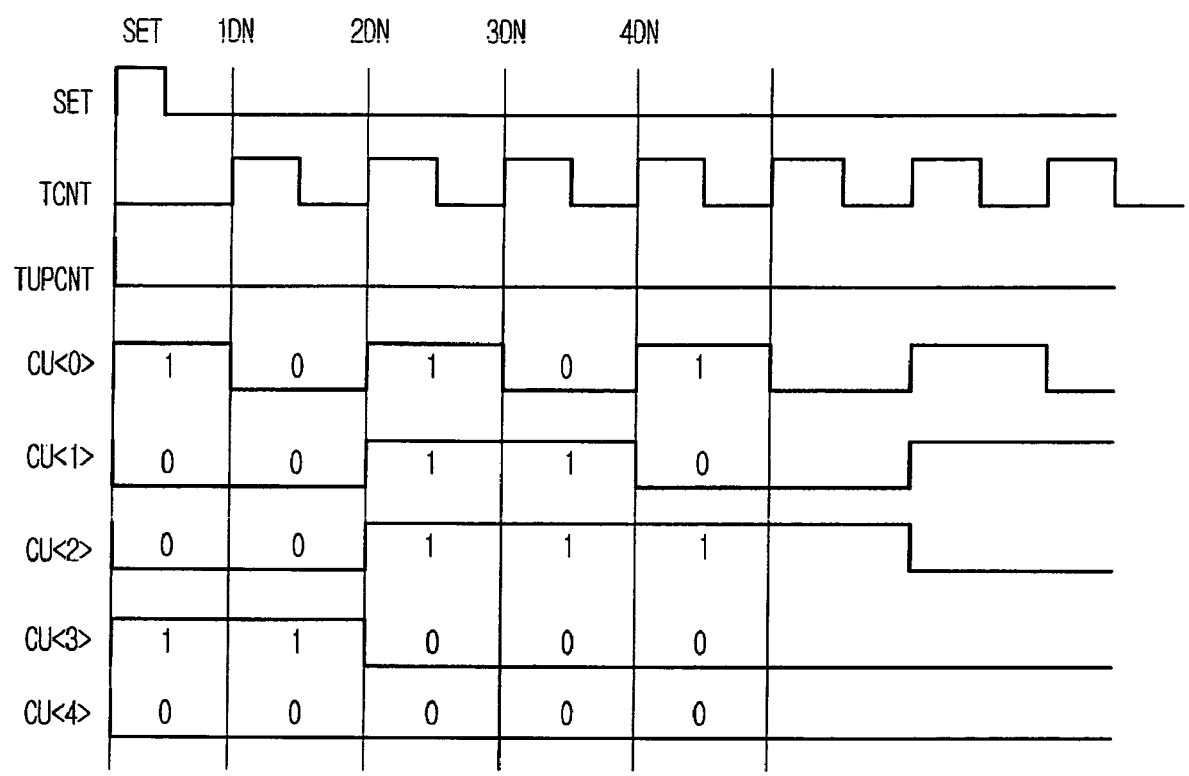
FIG. 5 is a timing diagram illustrating a down-counting operation of the internal voltage control device shown in FIG. 2.

FIG. 5 is a timing diagram illustrating the down-counting operation of the internal voltage control device shown in FIG. 2. As an example embodiment of the present invention, the case where i is 3 is explained.

When the count control signal TUPCNT becomes logic low level and the count signal TCNT is input, the bit counter 200 performs a down-counting operation from an initialized value. The plural flip-flops perform a counting operation in synchronization with a rising edge of the count signal TCNT. How many times the count signal TCNT is toggled corresponds to the number of down-counting. A code which is lower than a programmed value in the fuse block by counting-number could be generated.

In the present invention, a level of the internal voltage VINT adjusted based on process change could be increased or decreased preferredly. In a conventional device, different programmed codes are used in the fuse ROM block in order to control the internal voltage to a target level. In the present invention, however, levels programmed by the different codes can be controlled higher or lower in response to a counting-number. Thus a stable internal voltage can be generated from a lot of chips fabricated under process changes.

As described above, the present invention is used in an embodiment of worst condition and stress mode for distinguishing inferior goods on production of numerous semiconductor memory chips, experiment to generate optimum internal voltage or another embodiment of internal voltage required at particular timing of system. Further the present invention improves reliability and test/screen abilities of the semiconductor device. The present invention can be efficient in easily controlling internal voltage according to a system requirement not only in a production of solitary semiconductor memory chip but also in other applications such as Embedded and System On Chip.

The present application contains subject matter related to Korean patent applications Nos. 10-2005-0091571 and 10-2006-0040697, filed in the Korean Patent Office on Sep. 29, 2005 and May 4, 2006, respectively, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage controller, comprising:
    a fuse ROM block for generating a plurality of fuse signals, each signal having a different level according to a fuse condition;
    a bit counter for performing a counting operation to thereby generate a plurality of counter output signals;
    a decoder for decoding the plurality of counter output signals to activate one of a plurality of switching signals; and
    a reference voltage selector for adjusting a level of an internal reference voltage in response to the switching signals to generate an internal reference voltage.

2. The internal voltage controller as recited in claim 1, wherein the bit counter receives a set signal for initializing the plurality of fuse signals.

3. The internal voltage controller as recited in claim 2, wherein an initialized code of the plurality of counter output signals becomes higher according to an up-counting operation and lower according to a down-counting operation.

4. The internal voltage controller as recited in claim 1, wherein the bit counter counts a natural number i number of fuse signals and generates a natural number j, which is greater than i, number of counter output signals.

5. The internal voltage controller as recited in claim 1, wherein the bit counter performs an up-counting operation in synchronization with a falling edge of a count signal in a logic high level of a count control signal.

6. The internal voltage controller as recited in claim 1, wherein the bit counter performs down-counting operation in synchronization with a rising edge of the count signal in a logic low level of the count control signal.

7. The internal voltage controller as recited in claim 1, wherein the counter output signals are higher than codes programmed in the fuse ROM block by toggling counts of the count signal in up-counting operation.

8. The internal voltage controller as recited in claim 1, wherein the counter output signals are lower than codes programmed in the fuse ROM block by toggling counts of the count signal in down-counting operation.

9. The internal voltage controller as recited in claim 1, wherein the bit counter includes plural flip-flops performing an up/down-counting operation according to the set signal and the count control signal in response to the count signal.

10. The internal voltage controller as recited in claim 9, wherein i+1th flip-flop is set with supply voltage and i+2th flip-flop is set with ground voltage in the event that the number of the plural flip-flop is i+2, wherein i is a natural number.

11. The internal voltage controller as recited in claim 10, wherein a $2^{i-1}$ down-counting operation is performed when all the plural fuse signals have zero value.

12. The internal voltage controller as recited in claim 10, wherein a $2^{i-1}$ up-counting operation is performed when all the plural fuse signals have one value.

* * * * *